United States Patent [19]

Iizuka

[11] Patent Number: 5,466,109

[45] Date of Patent: Nov. 14, 1995

[54] LOAD STORING EQUIPMENT

[75] Inventor: Yukio Iizuka, Inuyama, Japan

[73] Assignee: Daifuku Co., Ltd., Osaka, Japan

[21] Appl. No.: 307,306

[22] Filed: Sep. 16, 1994

[30] Foreign Application Priority Data

Feb. 18, 1994 [JP] Japan .................. 6-020706

[51] Int. Cl.⁶ .................................... B65G 1/133
[52] U.S. Cl. .......................... 414/283; 414/940
[58] Field of Search .................. 414/277–283, 414/940

[56] References Cited

U.S. PATENT DOCUMENTS

| | | | |
|---|---|---|---|
| 4,787,804 | 11/1988 | Edenäs | 414/281 |
| 4,867,629 | 9/1989 | Iwasawa et al. | 414/940 X |
| 4,904,153 | 2/1990 | Iwasawa et al. | 414/940 X |
| 4,923,352 | 5/1990 | Tamura et al. | 414/940 X |
| 4,964,776 | 10/1990 | Wakita et al. | 414/277 |
| 5,059,079 | 10/1991 | Foulke et al. | 414/940 X |
| 5,064,337 | 11/1991 | Agakawa et al. | 414/283 X |
| 5,098,246 | 3/1992 | Jurg | 414/283 X |

FOREIGN PATENT DOCUMENTS

| | | | |
|---|---|---|---|
| 63-180610 | 7/1988 | Japan . | |
| 3-177208 | 7/1991 | Japan . | |
| 172203 | 7/1991 | Japan | 414/940 |
| 75905 | 3/1992 | Japan | 414/281 |

*Primary Examiner*—David A. Bucci
*Attorney, Agent, or Firm*—Barnes, Kisselle, Raisch, Choate, Whittemore & Hulbert

[57] ABSTRACT

A carrying in-and-out device is provided with four posts which are disposed in a distributive arrangement. The provision of the four posts ensures sufficient strength of the device even if the posts are formed thin, and the distributive disposition of the posts minimizes the turbulence and swirls of clean air to be caused when the clean air collides with the posts. As a result, there is little agitation of dust particles inside a passage. The dust particles are carried along without being scattered, and thus, loads can be prevented from adhering to the dust particles. Dust particles produced in an upper frame are sucked by upper fans and then discharged into the posts. The dust particles on the posts are further sucked by lower fans to be discharged downward.

5 Claims, 15 Drawing Sheets

LOAD STORING EQUIPMENT

FIELD OF THE INVENTION

The present invention relates to load storing equipment employed for storage of products, such as semiconductors, which should be strictly isolated from dust.

BACKGROUND OF THE INVENTION

Heretofore, as for this type of equipment, there has been provided load storing equipment of the closed type as found, e.g., in Japanese Laid-open Patent Application No. 3-177208(1991).

This conventional arrangement includes a load storing section (shelving) defining a plurality of vertically disposed storage spaces in a box-like main body, with the front surface of said section being opposed to the passage. The storing section is opened in its front surface opposed to the passage and its opposite rear surface, with a filter covering the rear surface, and an air feed passage is defined rearwardly of the filter and between the latter and the main body. Installed in the lower region inside the main body is a blower communicating in its delivery side with said air feed passage and in its suction side with the passage.

A carrying in-and-out device is installed in the passage and comprises a floor rail, a carriage supported and guided on said floor rail through wheels and adapted to travel in a given path extending along the front surface of the load storing section, a support frame erected from the carriage at one end as seen in the direction of the given path, a lifter guided by a guide body installed in the support frame, and a load holding device for transfer installed on said lifter.

In the conventional load storing device described above, the air discharged from the discharge section of the blower moves upward in the air feed path and through the individual filters to appear as highly clean air, which is fed to the load storing section through the rear surface, so that the load storing section is maintained highly clean by the clean air flowing from the rear surface to the front surface. The clean air passing through the load storing section in this manner flows downward in the path and is drawn again by the fan for circulatory use. The carrying-in-and-out device performs carrying in and out of loads with respect to the intended storage spaces by a combination of the traveling movement of the carriage, the upward and downward movements of the lifter and the transfer movement of the load holding device.

According to the conventional arrangement described above, the erected single support frame is rectangular in cross section and its transverse thickness and longitudinal width are increased from the standpoint of strength, with the result that the clean air passing through the load storing section flows against the support frame and is thereby disturbed to produce large swirls, thus producing an agitated state in the passage, scattering dust particles to cause the latter to adhere to the loads.

Further, the carrying in-and-out device has its overall length increased by the presence of the support frame which has its transverse thickness increased by the reception of all (almost all) of the lifter driving device, while when the load holding device is placed in opposed relation to the end of the load storing section, the support frame and other parts are positioned outwardly of the ends of the shelves. As a result, the box-like main body has to be formed large in size including the shunting space (dead space) for the support frame; thus, the number of stored loads in the spaces, i.e., the storage efficiency is lowered and the clean operation cost is increased.

Further, since the lifter is supported in a cantilever manner by the support frame, the lifter movement and warehousing and unwarehousing operations are attended with sway or the like movement and are unstable. On the other hand, if a pair of transversely spaced support frames are disposed, said shunting space is needed on each side of the given path.

The said lifter, as seen, e.g., in Japanese Laid-open Patent Application No. 63-180610(1988), is operatively connected to a lifter driving device disposed in a post through a slit formed in said post. And by the forward and reverse rotation of this lifter driving device, the lifter is moved upward and downward as it is guided by the guide body disposed in the post.

In this case, if the cross sectional area of the support frame is minimized, the connecting structure (lifting body) which operatively connects the lift to the lifter driving device, and the counter weight for balancing the upward and downward movements will be densely disposed in the support frame. Therefore, when the connecting structure and counter weight are moved upward and downward, a pumping phenomenon of air develops in the support frame, whereby the foul air in the support frame will be blown out into the cleaned main body through the slit.

Further, according to the conventional arrangement found in said Japanese Laid-open Patent Application No. 3-177208(1991), the dead space defined in the lower region of the load storing section for disposing a blower has a substantial height and hence leads to enlarging the shelves in their entirety and raising the level of the lowermost step in the load storing section to lower the storage efficiency.

DISCLOSURE OF THE INVENTION

A first object of the invention is to provide load storing equipment designed to eliminate disturbance or swirling of clean air from the shelves, the entire structure being simplified to minimize the shunting space (dead space) and being made compact, making it possible to effect warehousing and unwarehousing operations in a stabilized manner.

A second object of the invention is to provide load storing equipment adapted to automatically cope with the pumping phenomenon in the post.

A third object of the invention is to provide load storing equipment, wherein the entire structure can be simplified to decrease the dead spaces associated with the lower regions of the shelves and with the shunting side, thus simplifying and making compact the structure while increasing the storage efficiency.

To achieve the first object of the invention described above, load storing equipment of the invention is load storing equipment wherein shelves and a carrying in-and-out device are disposed in a cleaned compartment, said carrying in-and-out device comprising a lower main body supported and guided by a transverse floor rail, four posts erected on said lower main body, an upper frame connecting the upper regions of said posts, carriages each disposed for vertical movement between opposed surfaces of the posts, a carrying in-and-out tool disposed on each carriage, and at least one carriage lifting device disposed inside said posts and inside said lower main body.

According to such arrangement of the invention, loads stored on the shelves in the load storing equipment are maintained highly clean by clean air flowing From the rear surface to the front surface. And the clean air passing the shelves flows into the passage and then downwardly. At this time, part of the clean air flowing into the passage via the shelves collide with the carrying in-and-out device. The carrying in-and-out device is of the type having four posts and since sufficient strength can be obtained even if each post is thin, and since these posts are distributed front and rear, the clean air colliding with these posts produces little disturbance and infrequent small swirls. Thereby, the air in the passage can hardly be agitated, so that the dust can be moved aboard the descending flow without being scattered; thus, it is possible to prevent dust from adhering to loads.

For example, a load to be warehoused is received by the carrying in-and-out device and a combination of the traveling movement of the carrying in-and-out device, upward and downward movements of the carriage and transfer movement of the carrying in-and-out tool makes it possible to store the load on an intended shelf. During traveling, since the individual posts are thin and distributed front and rear, the disturbance of the clean air in the passage caused by the movement of these posts is small and only small swirls are produced.

In a first preferred embodiment of the invention, the individual posts are erected at the transversely spaced edges and in the longitudinally intermediate region and the longitudinally projecting portion of the lower main body is movable back and forth in the dead spaces defined below a pair of longitudinally spaced shelves.

According to this first preferred embodiment, during traveling of the carrying in-and-out device, the longitudinally projecting portion of the lower main body is movable back and forth in the dead spaces below the shelves and hence the transverse length of the lower main body can be made equal to the transverse pitch of the posts. Therefore, it follows that when the carrying in-and-out tool is opposed to the ends of the shelves, it does not project so much beyond the ends of the shelves. Thereby, the shunting space defined between the ends of the shelves and the longitudinal wall can be minimized, thereby making it possible to increase the number of loads stored in the load storing equipment, i.e., the storage efficiency, and decrease the size of the compartment to lower the clean-oriented operation cost.

In a second preferred embodiment of the invention, each corner of each quadrangularly prismatic post has a curved surface, whereby the flow of clean air upon collision is made smoother and produces only small swirls. And during traveling also, the disturbance of the clean air in the passage caused by the movement of the posts is decreased and only small swirls are produced.

In a third preferred embodiment of the invention, the upper frame is box-shaped, and its lower surface is formed with an upwardly concave portion starting at the respective points of connection to the posts.

According to this third preferred embodiment, when a load is carried in and out with respect to the uppermost step of the shelf, the upper portion of the load including the lift for carrying in-and-out movements can be positioned in the concave portion of the upper frame, thereby making it possible to decrease the overall height of the carrying in-and-out device. Therefore, the dead space defined above the uppermost shelf can be made smaller and the ceiling wall is positioned closer to the upper end of the carrying in-and-out device; thus, the number of stored loads relative to the height of the load storing equipment, i.e., the storage efficiency can be improved while the compartment is made smaller in size to lower the clean-oriented operation cost.

Furthermore, in a fourth preferred embodiment of the invention, the upper frame connected between the four posts is provided with guided assemblies to be guided by a ceiling rail, while there are installed fans having their suction ports directed to the guided assemblies and their delivery ports directed to the upper ends of the posts.

According to this fourth preferred embodiment, dust particles produced in the guided assemblies during traveling of the carrying in-and-out device and floating in the upper frame can be sucked by individual fans through their suction ports and discharged through their delivery ports into the upper regions of the posts. At that time, dust particles produced in the structural portion for guiding the upper portion of the carriage lifting device and floating in the upper frame can flow together with that flow. Thereby, the dust particles produced in the upper frame can be carried by the air current and conveyed down the posts; thus, they can be discharged from the lower main body toward the floor without leaking into the compartment.

In a fifth preferred embodiment of the invention, fans with their suction ports directed to the lower ends of the posts are installed in the lower main body.

According to this fifth preferred embodiment, suction forces can be applied to the lower regions of the posts by the operation of the fans; thus, a strong air current is produced in each post, flowing down from the upper end to the lower end. Therefore, dust particles produced in the upper frame are carried by the strong air currents and conveyed down the posts. Concurrently therewith, floating dust particles produced in the lower main body are also carried by the air currents and discharged-toward the floor. In this way, the dust particles produced in the various regions of the carrying in-and-out device can be discharged below the floor without leaking into the compartment.

In a sixth preferred embodiment of the invention, there are two carriage lifting devices disposed inside those two of the posts which are disposed at diagonally opposite positions and inside the lower main body. According to this embodiment, the carriage made integral with the pair of carriage lifting devices disposed at diagonally opposite positions is capable of upward and downward movements stably without sway. Further, the operation of the carrying in-and-out device is also stable.

In a seventh preferred embodiment of the invention, there are two carriage lifting devices each having a movable endless body extending through the two posts disposed at non-diagonally opposite positions, between the upper regions of the two posts and through the lower main body, including a lifter driving device for forwardly and reversely driving said movable body, one of the pair of posts being formed with a vertical slit through which said carriage is connected to said movable body, the movable body which is disposed in the other post being provided with a counterweight.

According to this seventh preferred embodiment, the movable bodies in the pair of posts at the diagonally opposite positions are forwardly and reversely driven by the lifter driving device, whereby the carriage integral with these movable bodies can be lifted and lowered stably without sway. In the other posts, the counterweight is lifted and lowered in the opposite direction, whereby the lifter driving device can be made compact and it is possible to effect upward and downward movements with less shock at the start and stop of said movement.

Further, in an eighth embodiment of the invention, the movable body is formed by a lifting body guided for upward and downward movements in one post and connected to a carriage through a slit, a counterweight capable of moving upward and downward in the other post, an upper rope-like body for connecting the upper portions of said lifting body and counterweight, and a lower rope-like body for connecting the lower portions thereof, said lower rope-like body being acted on by the lifter driving device.

According to this eighth preferred embodiment, since the movable body is composed of the lifting body and counterweight, and upper and lower rope-like bodies, the manufacturing cost can be saved and the maintenance is easy. Further, the upward and downward movement of the carriage is effected by driving the lower rope-like body forwardly and reversely by the forward and reverse driving of the lifter driving device.

And in an ninth embodiment of the invention, the two carriage lifting devices are installed by using a pair of transversely spaced posts, and a lifter driving device is installed, with its output shaft longitudinally extended, in the lower main body. According to this embodiment, the two carriage lifting devices can be positioned without changing the erected positions of the posts with respect to the lower main body. Further, the lifter driving device can be easily disposed in the lower main body by utilizing the longitudinally projecting portion of the lower main body without increasing the length of the lower main body.

In a tenth preferred embodiment of the invention, a travel driving device with its output shaft extending Longitudinally is installed in the lower main body. Therefore, the travel driving device can be easily disposed in the lower main body by utilizing the longitudinally projecting portion of the lower main body without increasing the transverse length of the lower main body.

To achieve the second object of the invention, the load storing equipment of the present invention is load storing equipment in which shelves and a carrying in-and-out device are disposed in a clean area, said carrying in-and-out device comprising a lower main body supported and guided by a floor rail, four posts erected on the lower main body, an upper frame connecting the upper portions of the posts, a carriage having a carrying in-and-out tool liftably disposed between the opposed surface of the posts, at least one carriage lifting device disposed to extend from the posts to the lower main body, there being two carriage lifting devices each including an endless movable body extending through a pair of posts, between the upper regions of the two posts and through the lower main body, and a lifter driving device for moving the movable body forwardly and reversely, the carriage being connected to the movable body through a vertical slit formed in one of the pair of posts, the movable body which is disposed in the other post being provided with a counterweight, the post formed with the slit and the post provided with the counterweight being connected together for communication through a duct.

According to such arrangement of the invention, during upward and downward movements of the carriage, either the connected assembly in the post or the counterweight in the post is lifted while the other is lowered, in which time the air compressed in the side associated with the upward movement flows into the duct and then into the post on the opposite side associated with the downward movement. In this way, during upward and downward movements, air is automatically traversed between the posts associated with the upward and downward movements, respectively, thereby automatically coping with the pumping phenomenon, so as to prevent the foul air in the post from flowing out into the clean compartment through the slit.

Further, during upward and downward movements of the carriage, the air compressed on the side associated with upward movement tends to be compressed greatly in the post partly because it is discharged to the upper region of the post by the fan; however, this air tending to be compressed flows into the duct and also into the post on the opposite side associated with downward movement. The air compressed on the side associated with downward movement can also be removed smoothly by the suction force of the fan.

In a preferred embodiment of the invention, the arrangement wherein the upper portions of the post formed with the slit and the post provided with the counterweight are connected for communication by the duct, makes it possible to automatically traverse the air between the post formed with the slit and the post provided with the counterweight.

To achieve the third object of the invention, the load storing equipment of the present invention is load storing equipment in which shelves and a carrying in-and-out device capable of traveling in a passage formed in front of said shelves are disposed in a clean compartment, each shelf defining a plurality of vertically and longitudinally spaced storage spaces, with a longitudinally extending dead space defined below the lowermost group of storage spaces, said dead space being opened in its surface opposed to the passage, said shelf being opened both in its surface opposed to the passage and in its opposite surface, a space being defined rearwardly of the opposite surface and communicating at its lower end with the dead space, the space mentioned last but one being provided with a clean air feeding unit covering the surface of said storage spaces, said carrying in-and-out device comprising a lower main body supported and guided by a floor rail, at least one post erected on said lower main body, a carriage capable of moving upward and downward along said post, and a carrying in-and-out tool disposed in said carriage, part of said lower main body being positioned in said dead space.

According to such arrangement, the operation of the clean air feeding unit draws air in the space and feeds highly clean air to the shelves from the rear surface thereof. Thereby, the loads stored on the shelves are capable of being maintained at a high degree of cleanness by the clean air flowing from the rear to the front. The clean air passing the shelves enters the passage and then flows downward, part or all of the flow is drawn into the space via the dead space by the suction force associated with the clean air feeding unit; thus, it is circulatorily used. Since the space is at the atmospheric pressure, there is no possibility of the air in this space which is of low degree of cleanness from leaking to the shelves or out of the compartment without passing through the clean air feeding unit.

Since the space below the shelves for the various devices (fans) can be dispensed with, the height of the dead space below the shelves can be decreased. Further, since the longitudinally projecting portion of the lower main body is movable in the dead space in the direction of travel, the various driving devices for the carrying in-and-out device can be disposed in this projecting portion, so that the height of the lower main body can be decreased and the lower limit position of the carriage can be lowered. Thereby, the shunting space can be decreased in size and the level of the lowermost storage space can be lowered, thereby making it possible to increase the number of loads stored relative to the installation space of the load storing equipment, i.e., the storage efficiency, and decrease the size of the compartments to decrease the operating cost.

In a first preferred embodiment of the invention, the clean air feeding unit comprises a box-like main body which is opened in its surface opposed to the shelves, filters covering the surfaces of the main body opposed to the shelves, and a fan disposed in the space of the main body, said fan having its delivery side directed to said filter and its suction side directed to the space.

According to this first preferred embodiment, in the clean air feeding unit, the air is drawn from the space by the suction side and the air discharged from the delivery side into the main body is passed through the filter to increase its degree of cleanness, whereupon such clean air is fed to the shelves from the rear side thereof.

In a second preferred embodiment, clean air feeding units are installed in a plurality of vertically spaced steps and a plurality of longitudinally spaced steps.

According to this second preferred embodiment, the provision of a number of clean air feeding units in the rear side of the shelves makes it possible to feed clean air uniformly from these clean air feeding units to the shelves.

In a third preferred embodiment of the invention, a pair of shelves are provided on opposite sides of the passage, and the longitudinally projecting portions in the lower main body are positioned in the dead spaces of the two shelves.

According to this third preferred embodiment, the various driving devices for the carrying in-and-out device can be distributively disposed in the longitudinally spaced projecting portions, making it possible to construct the lower main body in compact form while decreasing the size of the dead spaces defined below the shelves.

PREFERRED EMBODIMENTS OF THE INVENTION

An embodiment of the invention will now be described with reference to FIGS. 1 through 11.

Figure 1:
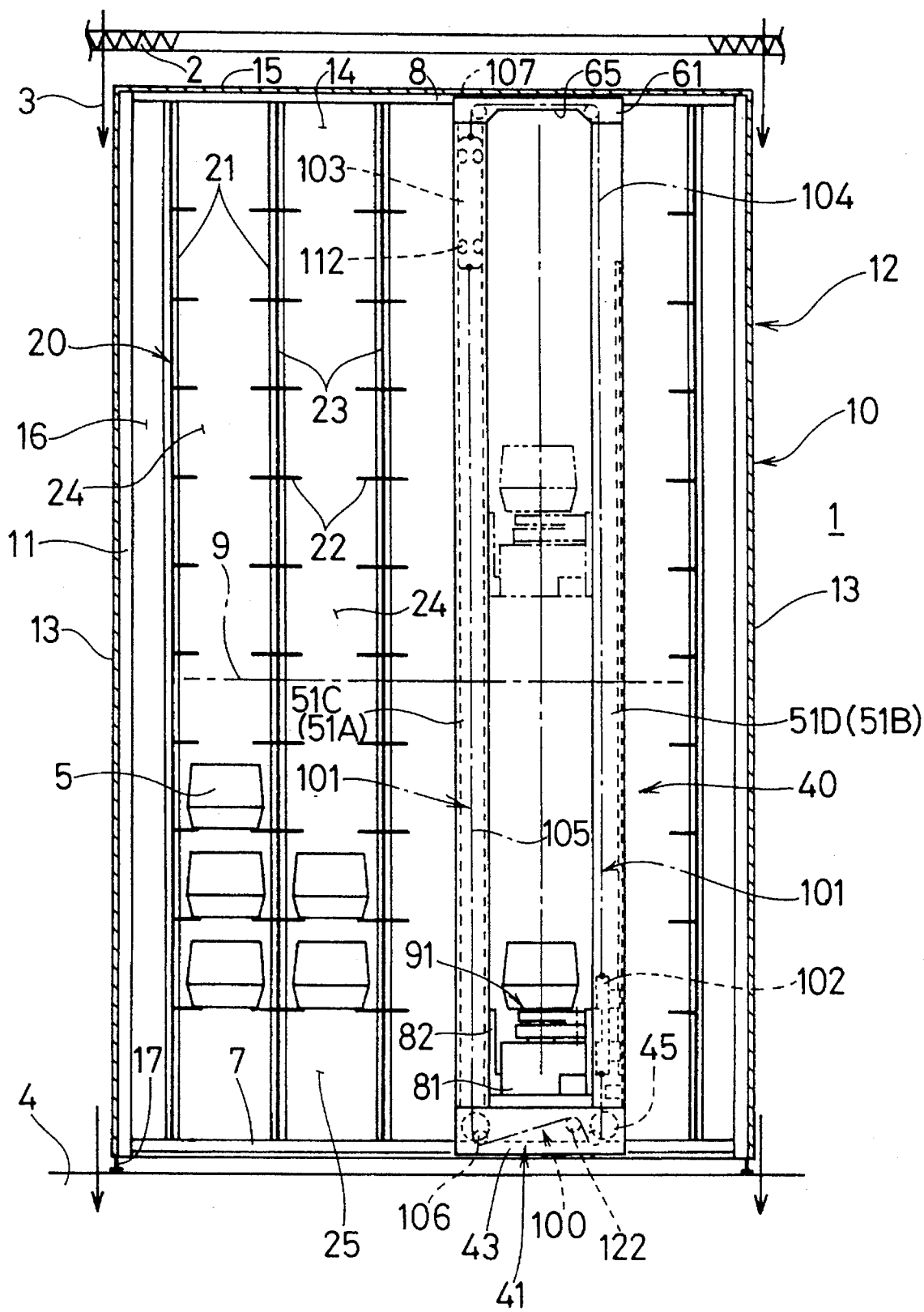
FIG. 1 is a side view, in longitudinal section, of load storing equipment, showing an embodiment of the invention.
Figure 2:
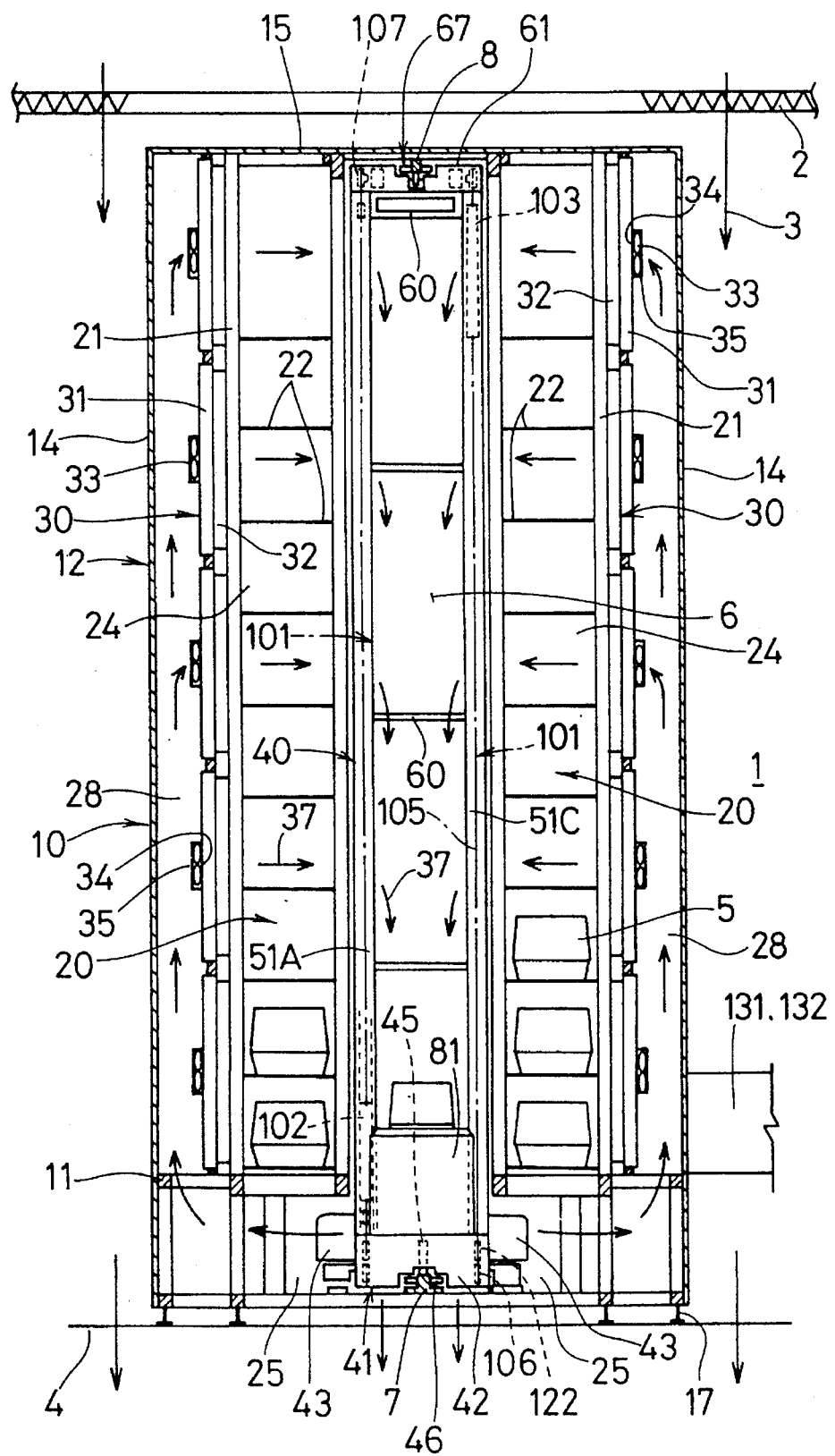
FIG. 2 is a front view, in longitudinal section, of said load storing equipment.
Figure 3:
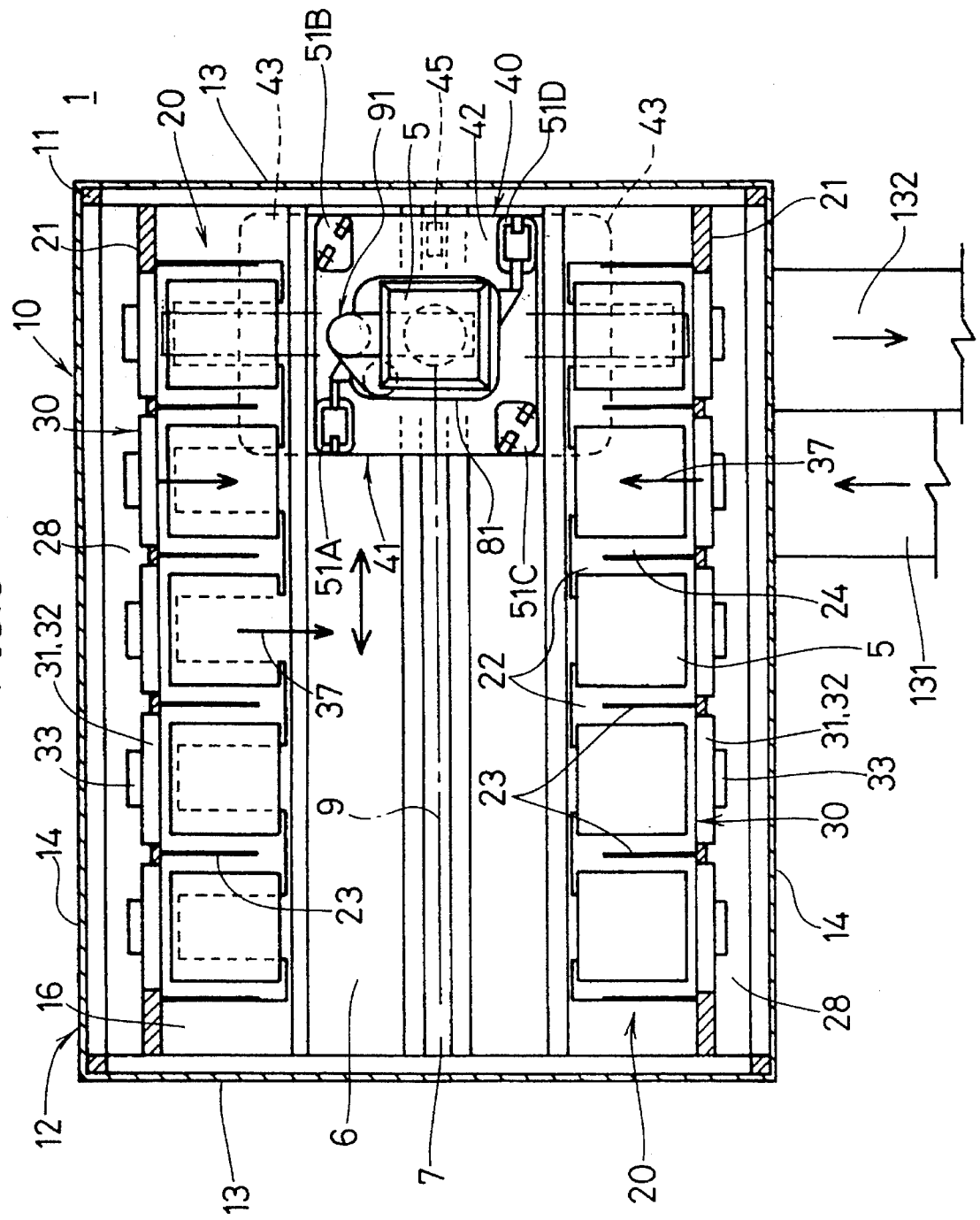
FIG. 3 is a plan view, in cross section, of said load storing equipment.
Figure 4:
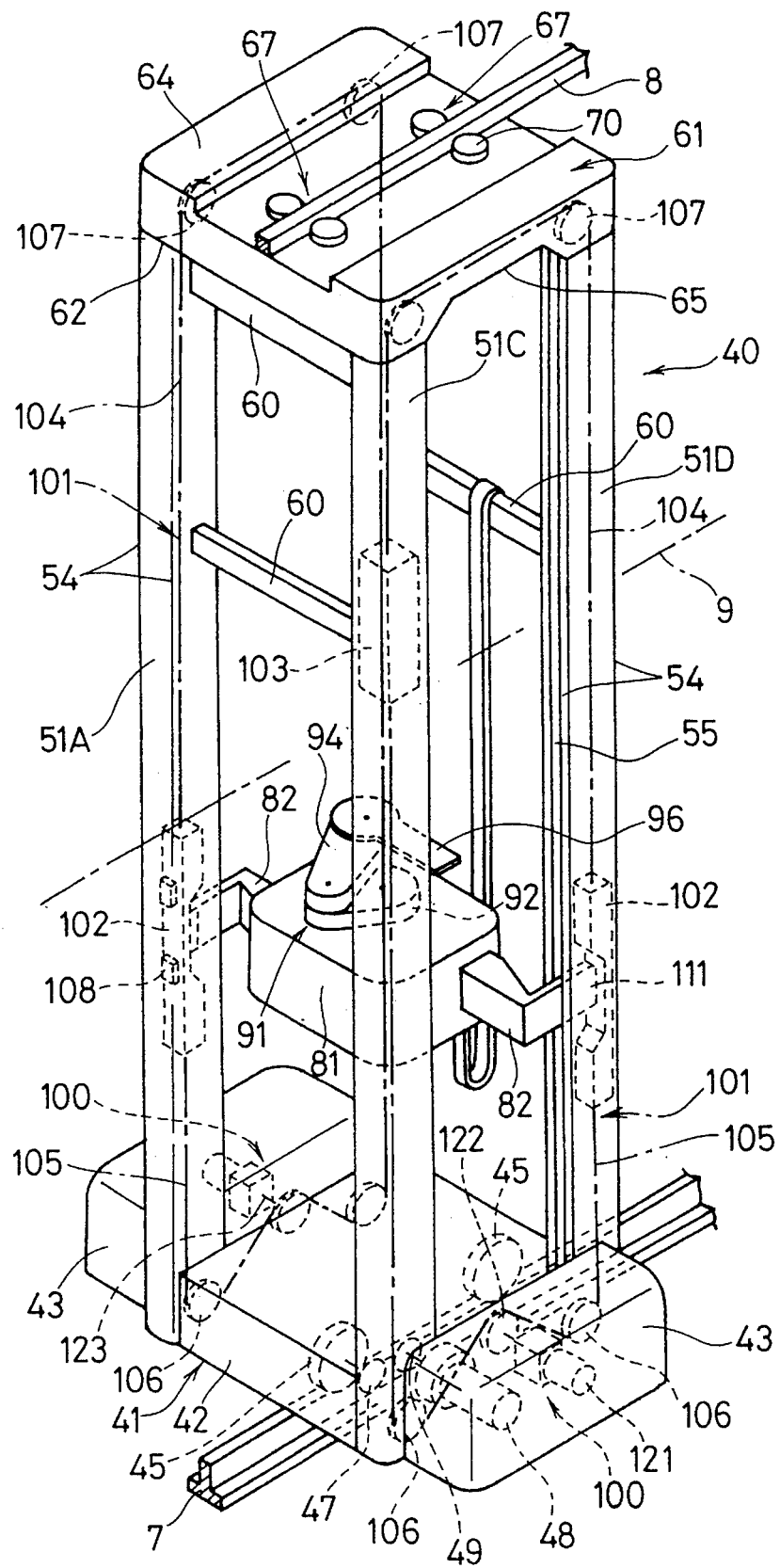
FIG. 4 is a perspective view for explaining a carrying in-and-out device for said load storing equipment.
Figure 5:
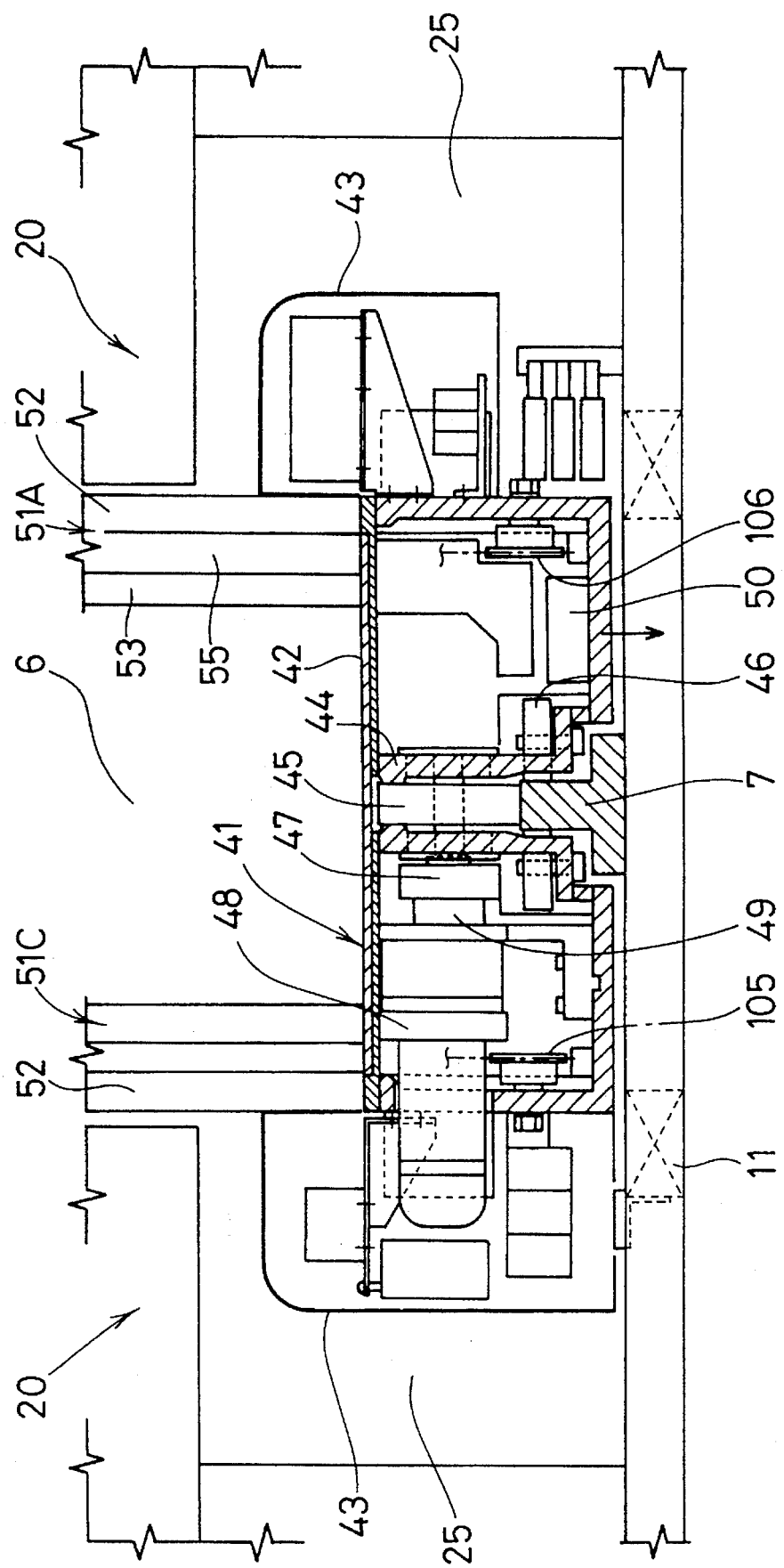
FIG. 5 is a rear view, in longitudinal section, of a lower main body portion of said load storing equipment.
Figure 6:
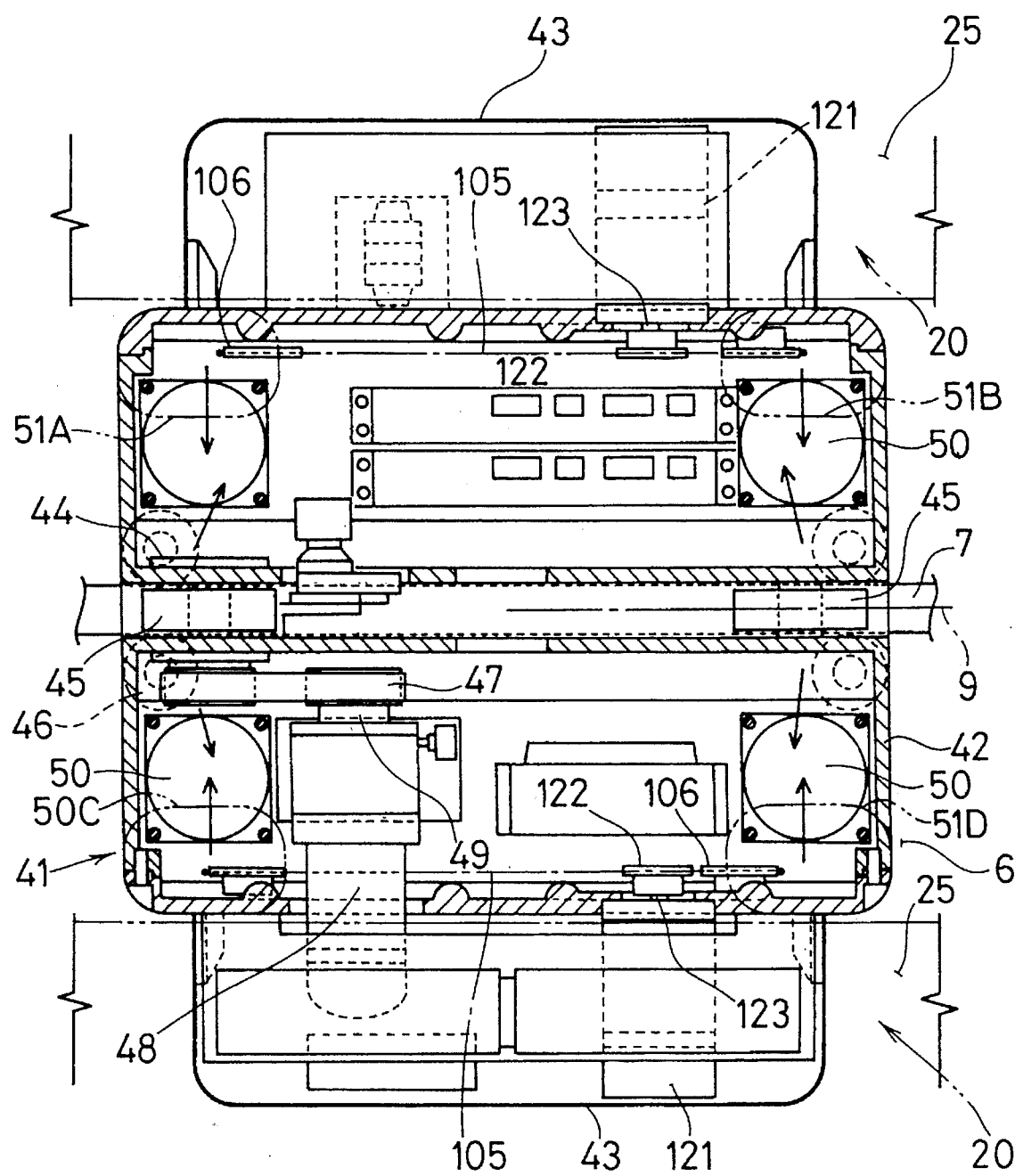
FIG. 6 is a rear view, in cross section, of the lower main body portion of said load storing equipment.
Figure 7:
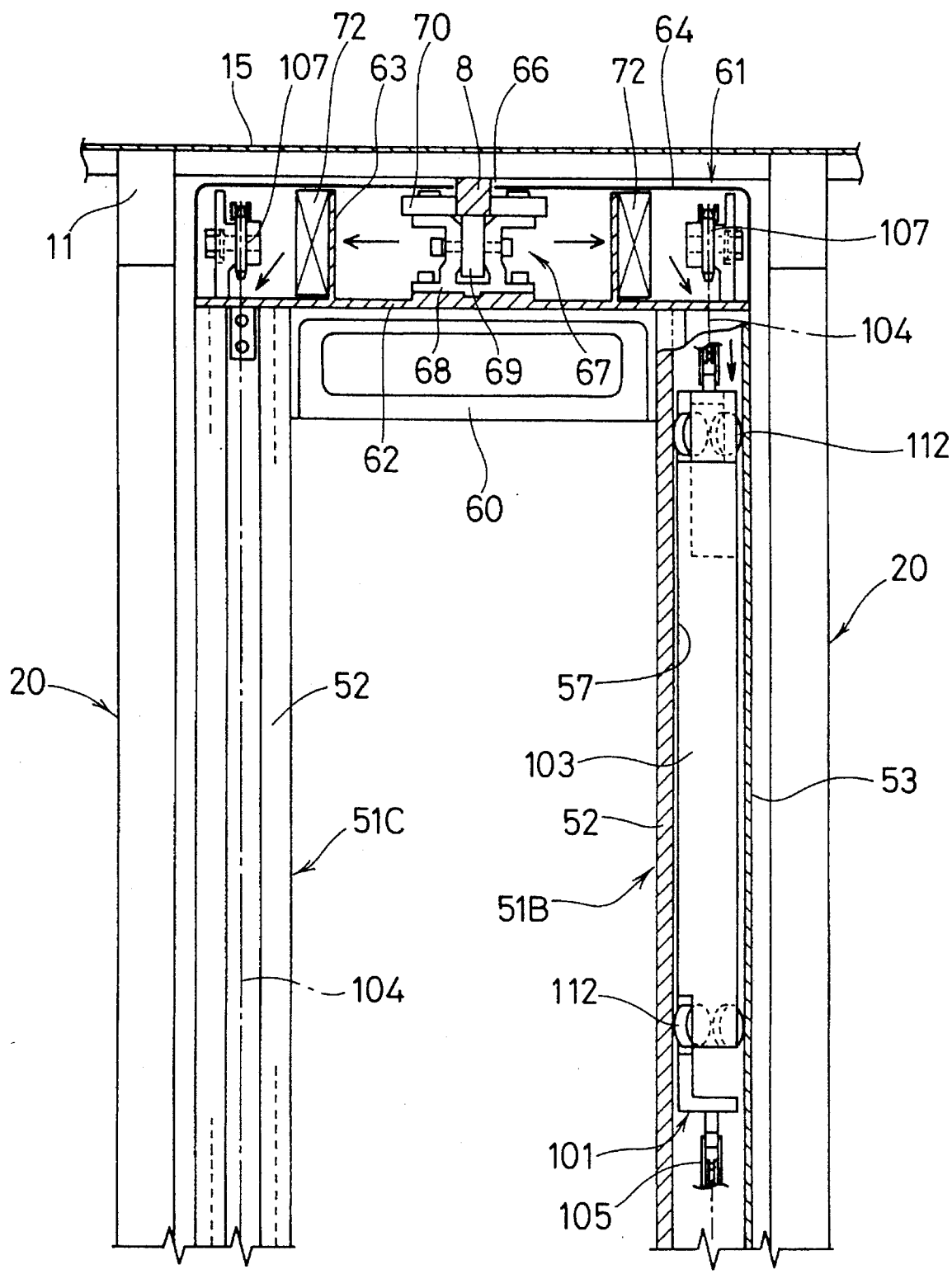
FIG. 7 is a rear view, partly broken away, of the upper frame portion of said load storing equipment.

In FIGS. 1 through 3, the numeral 1 denotes a clean room. Clean air 3 is blown downward from the ceiling (or side wall) through a filter 2, the lowering clean air 3 being sucked through a mesh type floor 4 into the space under the floor.

The numeral 10 denotes closed type load storing equipment with a cleaning device. A box-like enclosure 12 attached by utilizing the outer surface of a reinforcing frame 11 comprises front and rear walls 13, right and left walls 14 and a ceiling wall 15; thus, a compartment 16 is internally defined. This compartment 16 is opened in part or all of its lower surface, and the load storing equipment 10 is installed on the floor 4 through ground engaging elements 17.

Installed in said compartment 16 are a pair of shelves 20 with their front surfaces opposed to each other. Each shelf 20 comprises a shelf frame 21 serving to reinforce the enclosure 12, a plurality of vertically spaced shelf plates 22, and a plurality of longitudinally spaced vertical partition plates 23, said shelf plates 22 and vertical partition plates defining a plurality of vertically and longitudinally spaced storage spaces 24. Both shelves 20 are prepared as a pair and positioned on opposite sides of a passage 6, and their sides facing the passage 6 are termed front surfaces. Defined below the two shelves 20 are dead spaces 25 which a necessarily defined below the storage spaces 24, said dead spaces being opened in their front surface and extending over the entire longitudinal length free of obstacles.

Both shelves 20 are opened in their front surfaces opposed to the passage 6 and in their opposite rear surfaces and spaces 28 are defined between the rear surfaces and said right and left walls 14. Clean air feeding units 30 in five vertically spaced steps (plurality of vertically spaced steps) are installed in said spaces 28 in such a manner as to cover the rear surfaces of said storage spaces 24. In addition, in the transverse direction, five steps of clean air feeding units 30 are shown, but a single step or a plurality, other than five, of steps may be provided. Further, the spaces 28 communicate at their lower ends with the dead spaces 25.

Each clean air feeding unit 30 comprises a front-opened box-like main body 31, a filter 32 disposed to cover the front surface of the main body 31, and a fan 33 installed on the rear surface of the main body 31. The fan 33 has its delivery side 34 directed to said filter 32 and its suction side 35 opened to said space 28.

A carrying in-and-out device 40 is installed in said passage 6. The carrying in-and-out device 40 comprises a lower main body 41 supported and guided by a longitudinally extending floor rail 7 through a frame 11 in the lower region of the passage 6, four posts 51A, 51B, 51C, 51D erected from the lower main body 41, an upper frame 61 connecting the upper ends of said posts 51A through 51D and guided by a ceiling rail 8, a carriage 81 disposed for upward and downward movements between the opposed surfaces of said posts 51A through 51D, a carrying in-and-out tool 91 disposed on said carriage 81, a carriage lifting device 100 disposed inside the 51A through 51D and inside the lower main body 41. The carrying in-and-out device is adapted to travel back and forth in a given path 9 which longitudinally extends.

The lower main body 41, as shown in FIGS. 2 and 4 through 6, comprises a flat box-like central box 42, and long box-like lateral boxes 43 extending outwardly from the right and left sides of said central box 42. The lateral boxes 43 longitudinally projecting are positioned and longitudinally movable in the dead spaces of said shelves 20. Further, the central box 42 has its upper surface positioned below the level of the upper surfaces of the lateral boxes 43.

A pair of transversely spaced wheels 45 are disposed in the central region of the central box 42 through bearings 44 or the like. The wheels 45 are mounted on the floor rail 7, and to prevent the wheels 45 from running off the rail floor rail 7, the central box 42 is provided with a pair of longitudinally spaced rollers 46 adapted for contact with the lateral surfaces of the floor rail 7. One wheel 45 is operatively connected to a travel driving device (geared motor or the like) 48 through a wrapping connector 47, and said travel driving device 48, with its output shaft 49 directed longitudinally, part of its main body positioned inside the lateral box 43.

As shown in FIGS. 2, 4, 6, 11, said posts 51A through 51D are of quadrangular in their cross section and formed by joining two members, L-shaped members 52 and 53 of aluminum, the four corners of each of the posts 51A through 51D are formed as large curved surfaces 54. The posts 51A through 51D are erected at the four corners of the central box 42; thus, they are located one the transverse edges and longitudinal intermediate portion of the main body 41. The lower ends of the posts 51A through 51D communicate with the central box 42 through a through-hole formed in the top plate of the central box 42, and lower fans 50 are installed in the central box 42 with their suction sides opposed to the respective communicating portions (at the lower ends of the posts).

Of the posts 51A through 51D, one pair 51A, 51D which are at the diagonally opposite positions are formed in their inner surfaces as seen in the direction of the given path 9 with vertical slits 55 extending throughout the length, and their innermost regions are formed with inner dovetail grooves 56 extending throughout the length in opposed relation to the slits 55. Of the posts 51A through 51D, the other pair 51B, 51C which are at diagonally opposite positions have their corner portions at inner diagonally opposite positions formed as roller guide surfaces 57.

The surfaces of the posts 51A through 51D which are at inner positions orthogonal to the given path 9 are formed with outer dovetail grooves 58 extending vertically throughout the length. The posts opposed to each other in the orthogonal direction, i.e., the posts 51A and 51C and the posts 51B and 51D are connected together at a plurality of vertically spaced places thereon by connecting members 60 through connectors (bolts and nuts) 59 acting on the outer dovetail grooves 58, whereby they are reinforced.

The upper frame 61, as shown in FIGS. 1, 4, 7 through 9, is formed as a flat box by a base plate connected and fixed to the upper ends of the posts 51A through 51D, an upward rib 63 integral with said base plate 62, and a cover 64 disposed above the base plate 62 by utilizing the rib 63. The lower surface of the base plate 62 is formed with an upwardly concave portion 65 starting from the junctions between the posts 51A through 51D in the direction of the given path 9.

The central region of the cover 64 which is orthogonal to the given path 9 is formed with a slit 66 extending along the given path 9 and a ceiling rail 8 is fitted in said slit 66. Guided assemblies 67 to be guided by the ceiling rail 8 are installed in a pair in the upper frame 61 to extend in the direction of the given path 9. Each guided assembly 67 comprises a support bracket 68 fixed on the base plate 62, a float preventing roller 69 supported by the support bracket 68 and adapted for contact with the lower surface of the ceiling rail 8, and a pair of sway preventing rollers 70 supported by said bracket 68 and adapted for contact with the opposite lateral surfaces of the ceiling rail 8.

The posts 51A through 51D are connected to the four corners of the base plate 62 in the upper frame 61, at which corners the upper ends of the posts 51A through 51D communicate with the interior of the upper frame 61 through a through-hole 71 formed in the base plate 62. Further, installed inside the upper frame 61 are upper fans 72 with their suction sides associated with the guided assemblies 67 and their delivery sides opposed to the respective communicating regions 71 (or associated with the upper ends of the posts), said upper fans 72 being fixed in position by the upward ribs 63.

As shown in FIGS. 1, 4, 10, 11, said carriage 81 is in the form of a rectangular box whose longitudinal lateral surfaces are provided with connecting members 82 extending to the slits 55 in the supports 51A, 51D and whose upper surface is provided with a turntable 83. The carrying in-and-out tool 91 is installed on said turntable 83 for rotation around-the vertical axis 84. That is, said carrying in-and-out tool 91 comprises a first rotatable link 92 connected at its proximal end to the output shaft 85 from the turntable 83, a second link 94 connected at its proximal end to the free end of the first link 92 through an intermediate shaft 93, and a plate-like load supporting member 96 connected at its proximal end to the free end of side second link 94 through an actuating shaft 95. And the two links 92 and 94 are in the form of cases in which transmission mechanisms 97 and 98 are disposed.

Figure 10:
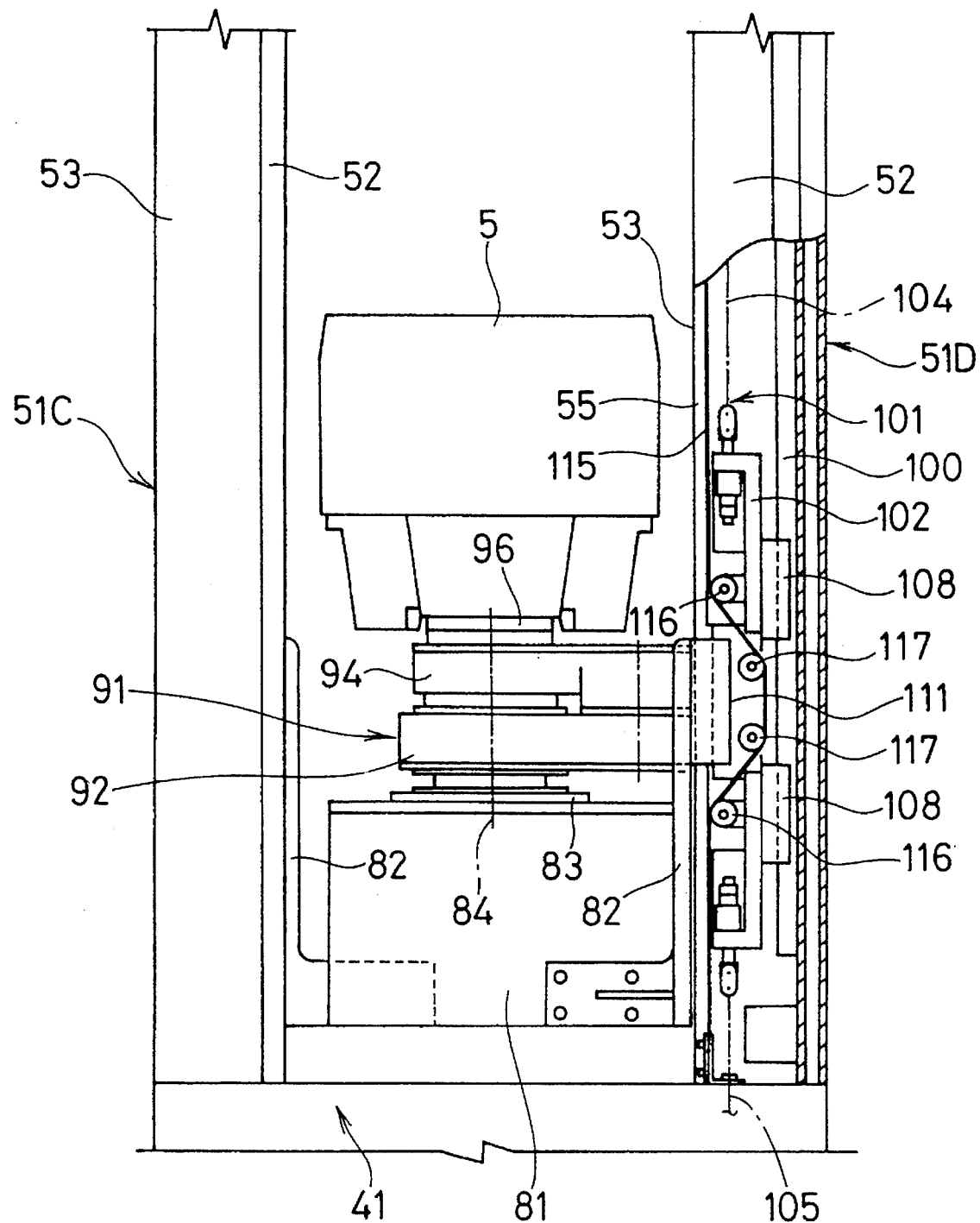
FIG. 10 is a plan view, partly broken away, of the carriage portion of said load storing equipment.
Figure 11:
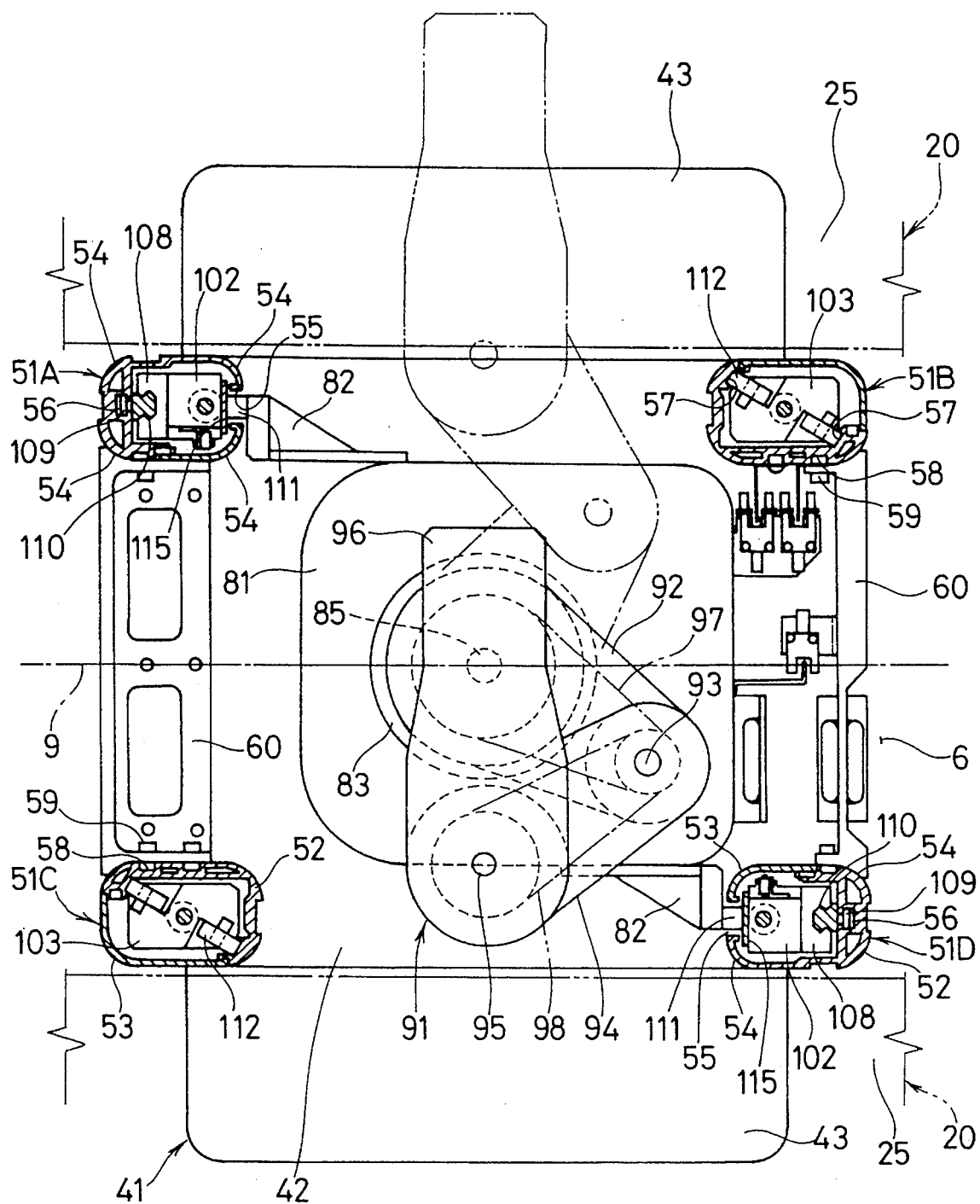
FIG. 11 is a plan view, in cross section, of a carrying in-and-out device for said load storing equipment.
Figure 12:
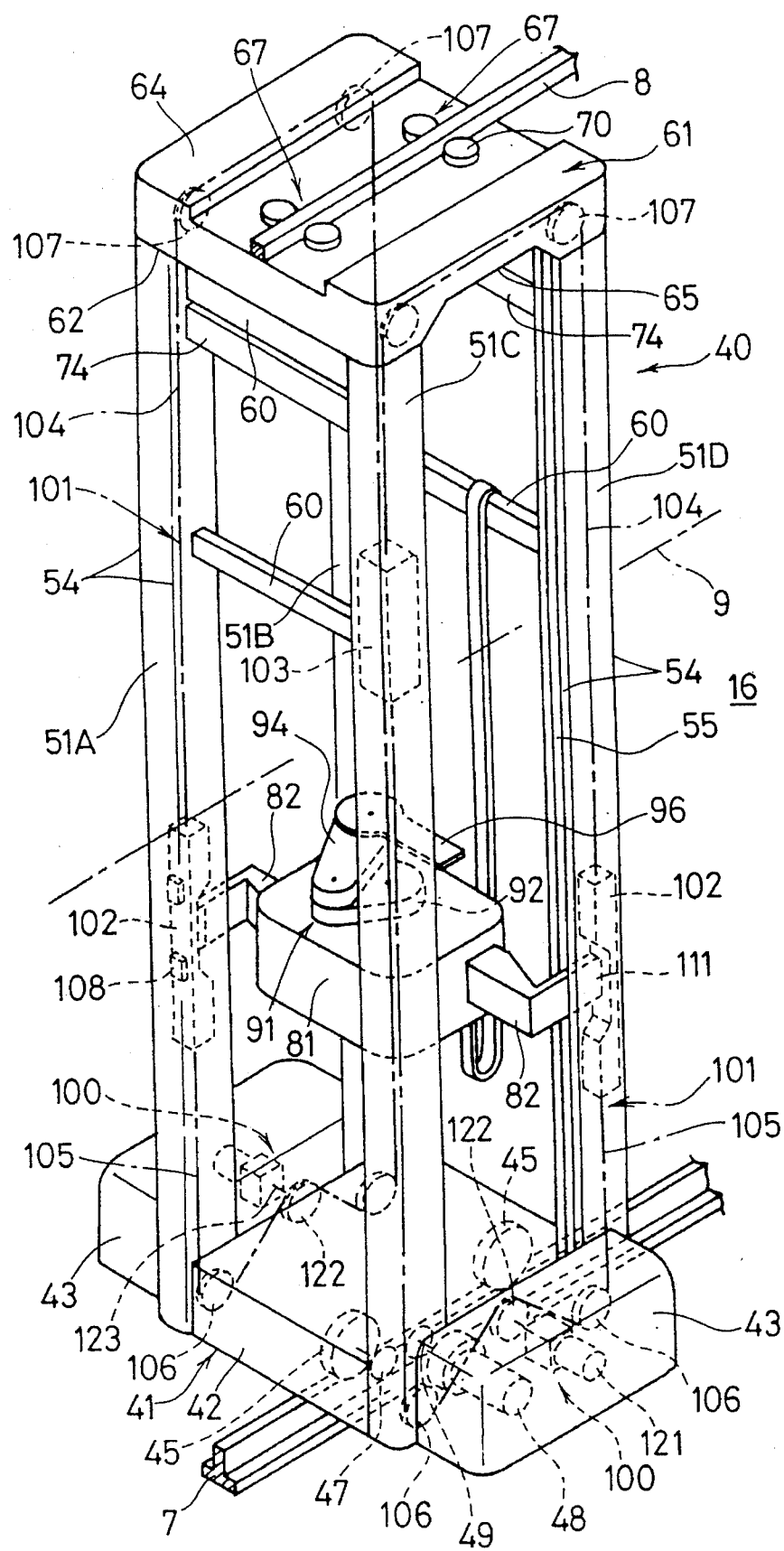
FIG. 12 is a perspective view for explaining a carrying in-and-out device for load storing equipment, showing another embodiment of the present invention.
Figure 13:
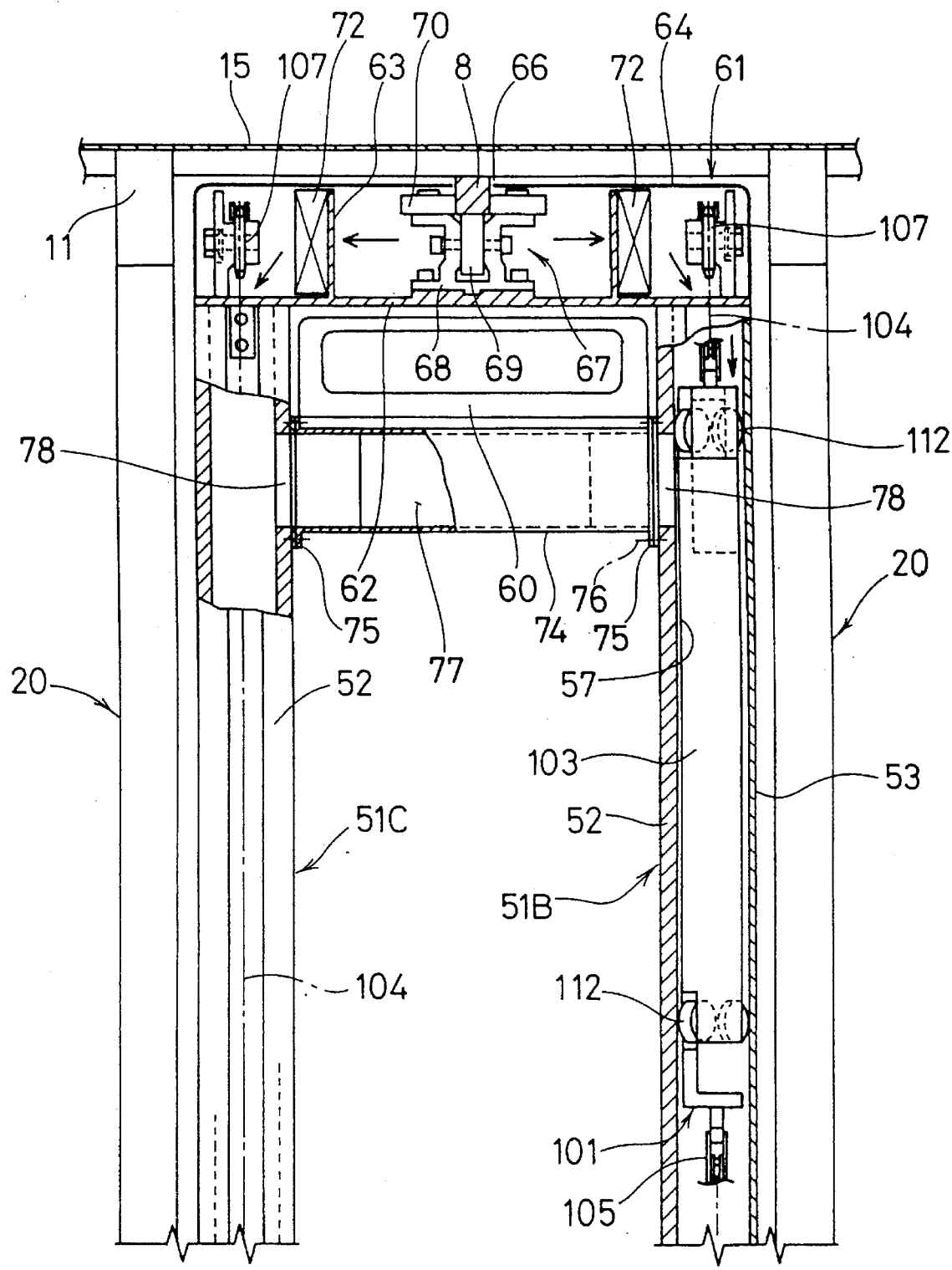
FIG. 13 is a rear view, partly broken away, of the upper frame portion of said load storing equipment.
Figure 14:
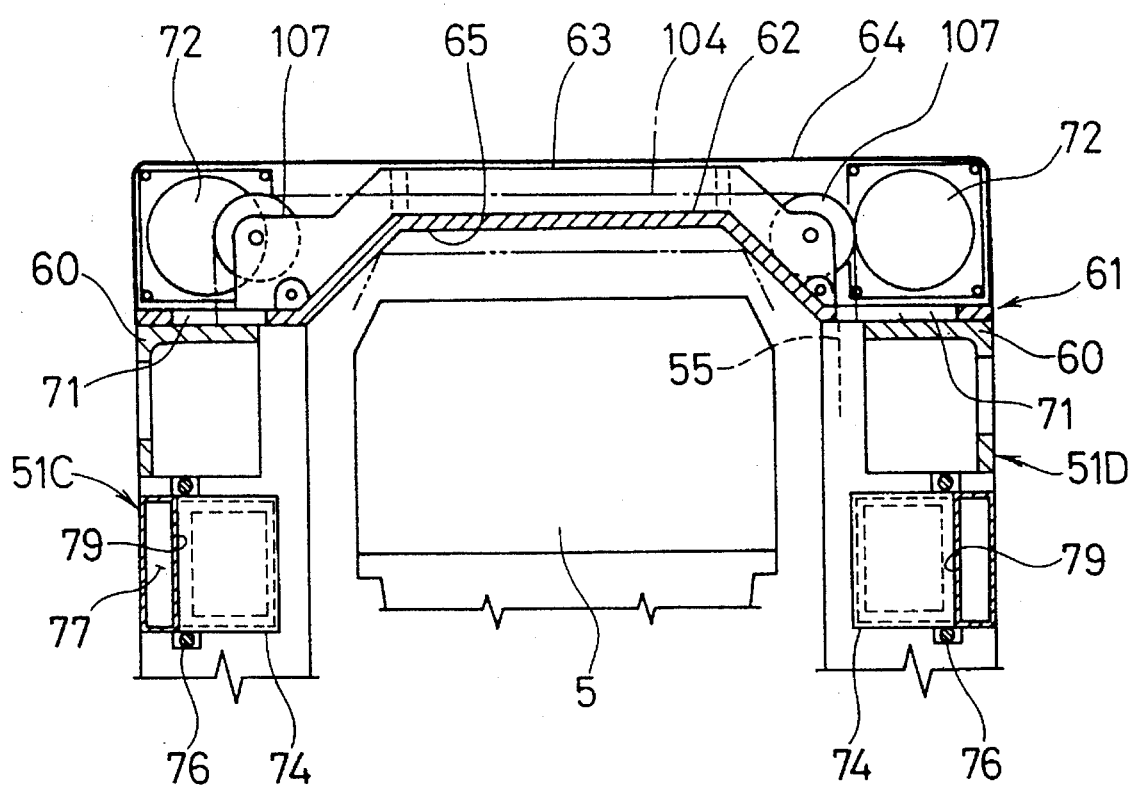
FIG. 14 is a side view, partly broken away, of the upper frame portion of said load storing equipment.
Figure 15:
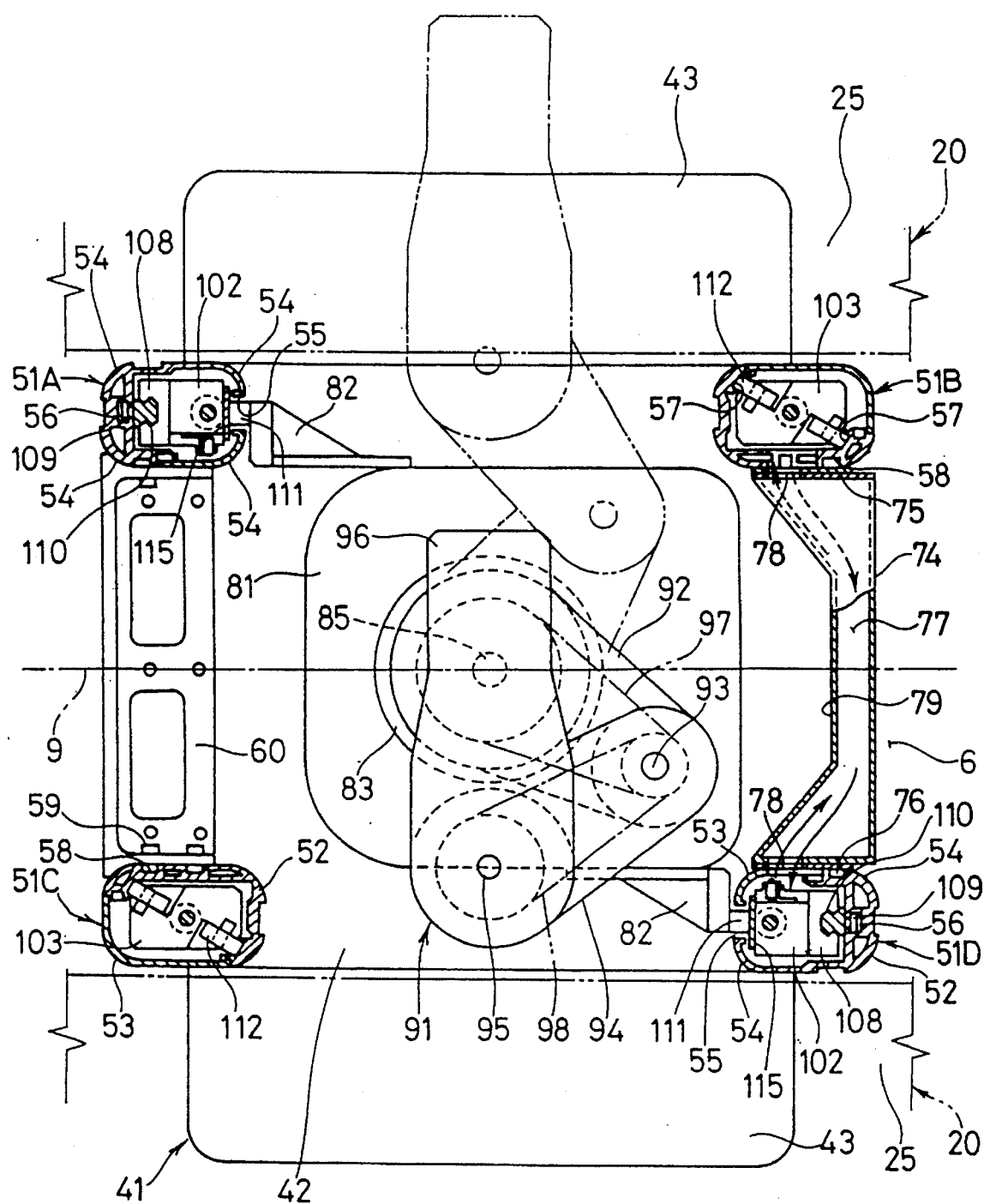
FIG. 15 is a plan view, in cross section, of the carrying in-and-out device for said load storing equipment.

These transmission mechanisms 97 and 98 are disposed and constructed such that when the first link 92 is turned to one side on the turntable 83 by turning the output shaft 85 in one direction, as shown in solid lines in FIG. 11, the second link 94 is received on the carriage 81 at one end and the load supporting member 96 is substantially received on the carriage 81 and such that when the first link 92 is turned to the other side by turning the output shaft 85 in the other direction as shown in phantom lines in FIG. 11, the free end of the second link 94 is swung outwardly with respect to the carriage and the load supporting member 96 is laterally linearly moved until it projects outwardly of the carriage 81. As shown in FIGS. 1, 4, 5 through 11, there are two carriage lifting devices 100, each comprising an endless movable body 101 extending through the paired posts 51A, 51B and 51C, 51D disposed at non-diagonally opposite positions, through the upper frame 61 between the upper regions of the posts 51A, 51B and 51C, 51D, and through the lower main body 41, and there is a lifter driving device 121 for forwardly and reversely rotating the movable body 101.

That is, said movable body 101 comprises a lifting body 102 guided for upward and downward movements in one pair of posts 51A, 51D and connected to the carriage 81 through the slits in the posts 51A, 51D, a counterweight 103 capable of upward and downward movements in the other pair of posts 51B, 51C, an upper chain (an example of an upper rope-like body) 104, interconnecting the upper portions of the lifting body 102 and counterweight 103, and a lower chain (an example of a lower rope-like body) 105 interconnecting the lower portions of the lifting body 102 and counterweight 103.

At positions opposed to the delivery sides of the lower fans 50 in the lower body 41, lower guide chain wheels 106 are rotatably installed with the lower chain 105 entrained therearound, and at positions opposed to the delivery sides of the upper fans 72 in the upper frame 61, upper guide chain wheels 107 are rotatably installed with the upper chain 104 entrained therearound.

The lifting body 102 is a long-sized frame having sliders 108 on the upper and lower portions of the inner surface thereof. The sliders 108 are fitted on a vertical guide rail 110 fixed in position through connectors 109 acting on the inner dovetail groove 56 in each of the posts 51A, 51D, whereby the lifting bodies 102 are capable of upward and downward movements without swaying in the posts 51A, 51D. The connecting members 111 from the lifting bodies 102 project outwardly through the slits 55 in the posts 51A, 51D, the projecting portions thereof having said connecting members 82 from said carriage 81 connected thereto through fixtures. Further, the counterweight 103 is a rectangular rod having guide rollers 112 attached thereto at its upper and lower regions, said guide rollers being capable of contact with said roller guide surface 57.

The lifter driving devices 121 are constructed to act on the lower chains 105. That is, the central box 42 in the lower main body 121 has driving chain wheels 122 each disposed between the two guide chain wheels 106. Each driving chain wheel 122 is operatively connected to said lifter driving device (geared motor or the like) 121, said lifter driving device 121 having its output shaft 123 longitudinally extended and substantially positioned in the lateral box 43. In this manner, the two carriage lifting devices 100 are installed by using the pairs of posts 51A, 51B and 51C, 51D disposed front and rear.

As shown in FIGS. 10 and 11, the slits 55 in the pair of posts 51A, 51D are closed by cover layers 115 from inside. Each cover layer 115 is a vertically long-sized strip fixed at its upper and lower ends to the inner surface of the post 51A, 51D. And the pair of pressing rollers 116 disposed on each lifting body 102 at the upper and lower regions thereof are pressed against the rear surface of the cover layer 115, whereby the cover layer 115 is pressed against the inner surface of the post 51A, 51D, thus closing the slit 55.

Between the two pressing rollers 116, the pair of separator rollers 117 are contacted with the surface of the cover layer 115, whereby the portion of the cover a layer 115 positioned between the two pressing rollers 116 is separated from the inner surface of the post 51A, 51D so as to open the slit 85. And through the opened portion is positioned said connecting member 111.

In the load storing equipment of the above arrangement, as shown in FIGS. 1 through 3, there are carrying-in device 131 and a carrying-out device 132 for warehousing loads 5 of bucket type. As for such carrying-in and carrying-out devices 131 and 132, there are various types including conveyors and they are installed as by utilizing the lowermost storage space 24 in one shelf 20. A door or the like is provided for the region where such carrying-in and carrying-out devices 131 and 132 are installed.

The operation of the above embodiment will now be described.

In the load storing equipment with the cleaning device, a high degree of cleanness is maintained at all times. That is, the operation of the fans 33 draws the air in the spaces 28 through the suction sides 35 and discharges it through the delivery sides 34 into the main body 31. The discharged air passes through the filters 32 opposed thereto to become clean air 37 having a high degree of cleanness, which is then fed to the shelves 20 through the rear surfaces thereof. At this time, a high pressure chamber is defined between each fan 33 and the associated filter 32.

Therefore, loads 5 stored in the storage spaces 24 are maintained highly clean by the high pressure clean air flowing from the rear surface to the front surface. And the clean air 37 passing through the shelves 20 flows into the passage 6 and then flows downward, a portion of the air flowing out below the floor 4, the remaining large portion flowing into the spaces 28 through the dead spaces 25 under the suction forces produced by the fans 33; thus, it is put to circulatory use.

In circulatorily using the clean air 37 in this manner, part of the clean air 37 flowing into the passage 6 through the shelves 20 collides with the carrying in-and-out device 40. In the carrying in-and-out device 40 having four posts 51A through 51D, even if the posts 51A through 51D are thin, sufficient strength can be obtained and the posts are distributively disposed; therefore, the clean air 37 colliding with the posts 51A through 51D produces little disturbance and infrequent small swirls.

Further, since the corners of the posts 51A through 51D are formed as curved surfaces 54, the flow of air upon collision is smoother and produces less disturbance and infrequent small swirls. As a result, the air in the passage 6 is little agitated and the dust is carried by the downward flow without being scattered and is thus prevented from adhering to the loads 5.

During said operation of the clean air feeding units 30 since the air in the spaces 28 is at the atmospheric pressure, there is no possibility that the air having a low degree of cleanness in said spaces 28 bypasses the clean air feeding units 30 and instead leaks to the shelves 20 or leaks out through the junctions in the enclosure 12. Further, the provision of the clean air feeding units 30 having fans 33 in a plurality of vertically spaced steps in the rear surface of the shelves 20 makes it possible to feed clean air 37 uniformly from the clean air feeding units 30 toward the shelves 20. And the space for the various devices (fans) below the shelves 20 can be dispensed with and the level of the lowermost storage space 24 can be lowered.

For example, a load 5 to be warehoused is received by the carrying in-and-out device 40 through-the carrying-in device 131. And a combination of the traveling movement of the carrying in-and-out device 40, the upward and downward movements of the carriage 81 and the transfer movement of the carrying in-and-out tool 91 (see the solid and phantom lines in FIG. 11) makes it possible to store it in an intended storage space 24. Then, the turntable 83 is turned through 180 degrees around the vertical axis 84, whereby the free end of the load supporting member 96 can be opposed to an intended storage section 3 at a shelf 1. Further, the reverse operation of the carrying in-and-out device 40 makes it possible to unwarehouse a load 5 in an intended storage space 24 by the carrying-out device 132.

The traveling movement of said carrying in-and-out device is performed by forcibly rotating one wheel 45 forwardly and reversely through the wrapping connector 47 by the travel driving device 48, with the sway of the lower portion being prevented by the rollers 46 acting on the floor rail 7, with float being prevented by the float preventing rollers 69 acting on the ceiling rail 8, with the sway of the upper portion being prevented by the sway preventing rollers 70. During travel, since the posts 51A through 51D are thin and their corners are curved surfaces 54 and since they are distributively disposed, the disturbance of the air in the passage 6 caused by the movement of these posts 51A through 51D is little and the swirls are infrequent and small. Thus, the air in the passage 6 is less agitated, making it possible to carry dust particles on the downward air flow without scattering them and prevent them from adhering to the loads 5.

During travel of the carrying in-and-out device 40, the lateral boxes 43 containing the travel driving device 48 and lifter driving device 121 can be moved back and forth in the dead spaces 25 defined below the shelves 20; therefore, the transverse length of the lower main body 41 can be made equal to the longitudinal pitch of the posts 51A through 51D. Thus, when the carrying in-and-out tool 91 is opposed to the storage space 24 in the terminal row of the shelf 20, it follows that the carrying in-and-out device 40 does not project so much beyond the end of the shelf 20. Thus, the shunting space defined between the end of the shelf 20 and the wall 14 can be decreased in size; thus, the number of stored loads 5 relative to the installation space for the load storing equipment 10, i.e., the storage efficiency is improved and the clean-oriented operation cost is lowered.

Further, since the carriage, when brought to its lowermost position, is positioned close to the upper surface of the central box 42 which is lower than that of the lateral box 43, the storage spaces 24 in the lowermost step can be made low; thus, the number of stored loads 5 relative to the installation height for the load storing equipment 10, i.e., the storage efficiency is improved, the compartment 16 can be decreased in size and the clean-oriented operation cost is lowered.

The upward and downward movements of the carriage 81 are performed through the movable body 101 by forcibly rotating the driving chain wheel 122 by the lifter driving device 121. That is, the forward and reverse rotation of the driving chain wheel 122 moves the lower chain 105 forwardly and reversely, thereby lifting and lowering the lifting body 102 in the post 51A, 51D, thereby making it possible to lift and lower the carriage 81 which is integrated through the connecting members 111 and 82.

The upward and downward movements of the lifting bodies 102 are stably performed without involving sway as the sliders 108 are guided by the guide rails 110. And the carriage 81 integrated between the pair of lifting bodies 102 disposed at diagonally opposite positions is capable of stabilized upward and downward movement without sway.

Since the counterweight 103 can be lifted and lowered in the other posts 51B, 51C in the opposite direction, the lifter driving device 121 can be made compact and the upward and downward movements are attended with less shock at the start and stop of such movement. The upward and downward movement of the counterweight 103 is stably performed without sway since the guide rollers 112 are guided by the roller guide surface 57. Further, the upward and downward movements are reliably effected without involving slippage since the driving chain wheel 122 meshes with the lower chain 105. During upward and downward movements, most of the slit 55 in each of the posts 51A, 51B is closed by the cover layer 115 which contacts the inner side thereof. In the lifting body 102, the space between the separator rollers 117 alone is opened to allow the upward and downward movements of the connecting member 111, and since the pressing rollers 116 and separator rollers 117 are lifted and lowered together with the lifting body 102, the opened position of the cover layer 115 can be automatically adjusted according to the vertical position of the connecting members 111.

Figure 8:
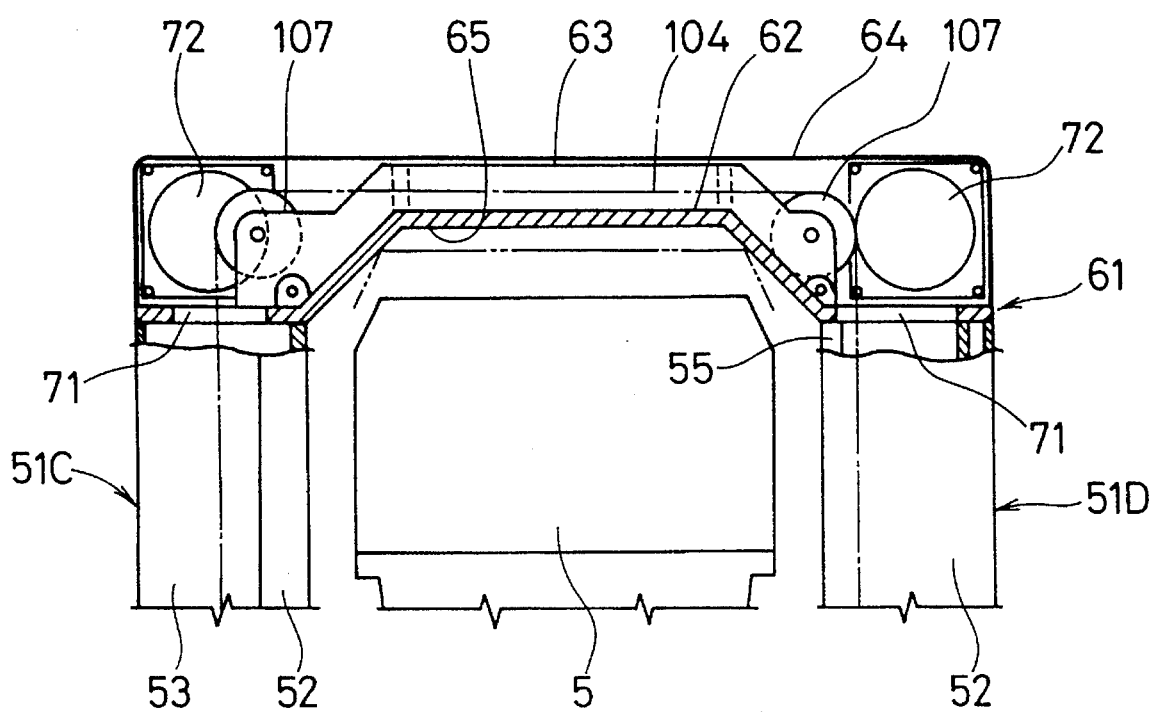
FIG. 8 is a side view, partly broken away, of the upper frame portion of said load storing equipment.
Figure 9:
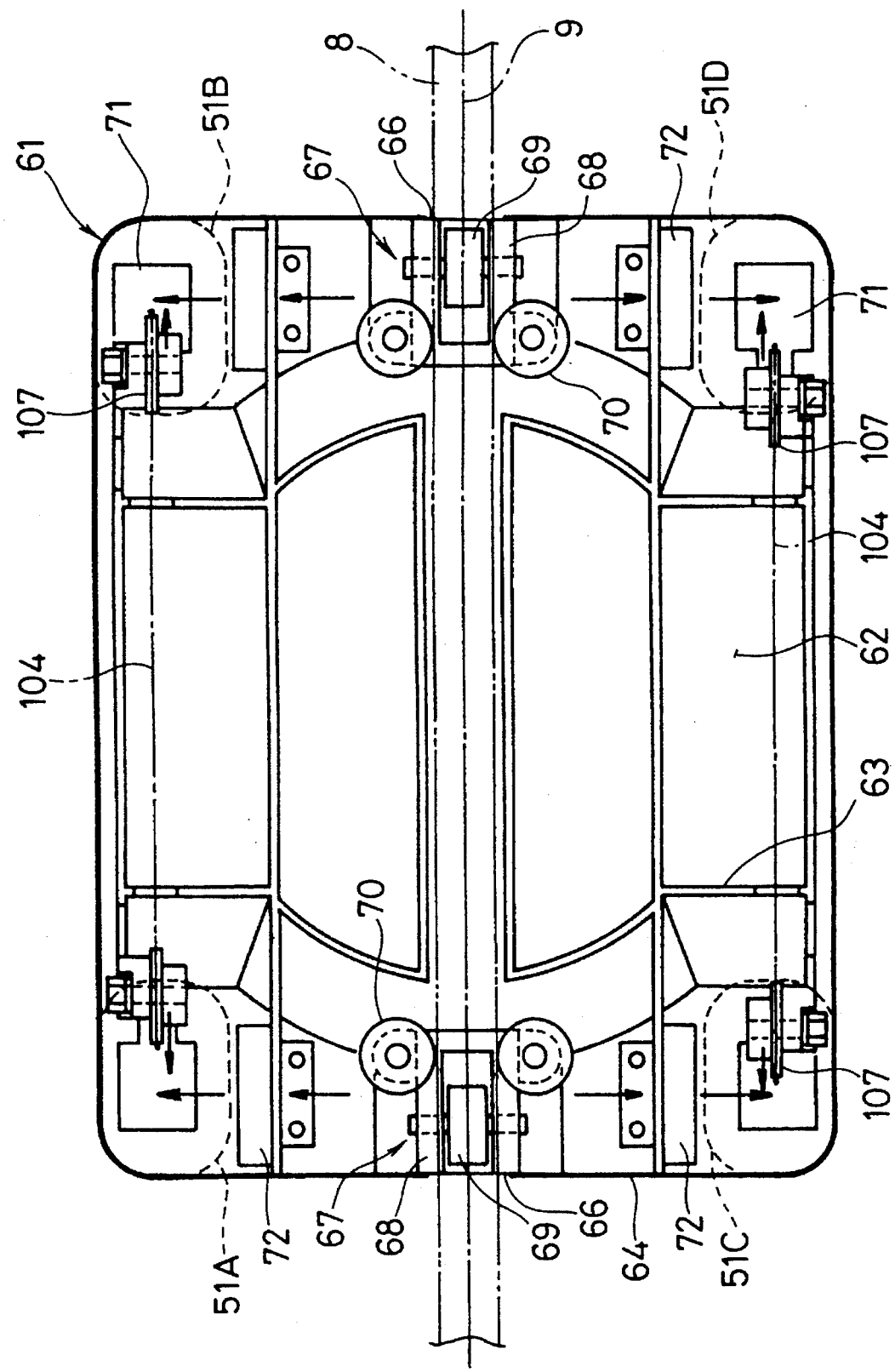
FIG. 9 is a plan view, in cross section, of the upper frame portion of said load storing equipment.

Further, during upward and downward movements, when the load 5 is carried in and out with respect to the uppermost storage space 24, as shown in solid lines in FIG. 8, the upper portion of the load 5, with the lift included, can be positioned in the recess 65 of the upper frame 61, whereby the overall height of the carrying in-and-out device can be decreased. Therefore, the dead space defined above the uppermost storage space 24 of the shelf can be decreased and the ceiling wall 15 can be brought close to the upper end of the carrying in-and-out device 40, thereby increasing the number of stored loads 5 relative to the height of the load storing equipment 10, i.e., the storage efficiency, decreasing the size of the compartment 16 and saving the clean-oriented operating cost.

During the travel described above, dust particles generated in the guided assemblies 67 and floating in the upper frame 61 are drawn by operation of the upper fans 72 through their suction ports and discharged to the upper regions of the posts 51A through 51D through their delivery ports. At this time, the dust particles generated around the upper guide chain wheels 107 and floating in the upper frame 61 join with the flow. Thereupon, the lower fans 50 in the lower main body 41 are also operated, applying suction forces to the lower regions of the posts 51A through 51D. Thus, it follows that in the posts 51A through 51D there are strong suction passages extending downwardly from above.

Thereby, the dust particles generated in the upper Frame 61 are carried by the air currents, flowing down the posts 51A through 51D and discharged from within the lower main body 41 to the floor 4. At the same time, the dust particles generated by the upward and downward movements of the lifting bodies 102 and counterweights 103 are also carried by the air currents down the posts 51A through 51D. Further, the dust particles generated at the wheels 45 and chain wheels 106, 122 and floating in the lower main body 41 are also carried by the air currents and discharged to the floor 4.

In this way, the dust particles generated in the various portions of the carrying in-and-out device 40 can be discharged below the floor 4 without leaking into the compartment 16.

In the above embodiment, the greater part of the clean air 37 which flows into the passage 6 and then downwardly is allowed to flow into the spaces 28 for circulatory use; however, all of it may be allowed to flow out below the floor 4 while feeding (supplementarily feeding) the spaced 28 from a separate place. Further, the clean air 3 from the side associated with the filter 2 may be allowed to flow downwardly in the passage 6. As for the clean air feeding units 30, those having various constructions are employed. Further, in the above embodiment, the load storing equipment 10 with a cleaning device has been installed in the clean room 1; however, it may be installed in an ordinary chamber.

In the above embodiment, the type in which the carrying in-and-out device 40 is installed in the pair of shelves 20 has been shown; however, a type in which one of the shelves 20 is combined with the carrying in-and-out device 40 may be used.

In the above embodiment, quadrangularly prismatic posts 51A through 51D have been shown; however, the posts 51A through 51D may be of various shapes including a circular cylinder.

In the above embodiment, the lower surface of the upper frame has been formed with the upwardly concave portion 65; however, the lower surface of the upper frame 61 may be flat.

In the above embodiment, the upper frame 61 has been provided has been provided with the guided assemblies 67 guided by the ceiling rail 8 and also with the upper fans 72; however, the carrying in-and-out device 40 may be one in which the guide structures guided by the ceiling rail 8 and the upper fans 72 are omitted. In this case, a pair of floor rails 7 will be employed. Further, in the above embodiment, the lower fans 50 have been installed in the lower main body 41; however, the carrying in-and-out device 40 may be one in which the lower fans 50 are omitted.

In the above embodiment, two carriage lifting devices 100 have been provided; however, one, three or four carriage lifting devices 100 may be disposed in the posts 51A through 51D. Further, two carriage lifting devices 100 may be disposed in the pair of posts which are at non-diagonally opposite positions.

In the above embodiment, the two carriage lifting devices 100 have been constructed of the movable bodies 101 extending between the pair of posts which are at non-diagonally opposite positions and the counterweights provided on said movable bodies 101; however, the movable bodies 101 may extend between the pair of posts which are at diagonally opposite positions or the counterweights 103 may be omitted. As for the movable bodies 101, various types may be used.

In the above embodiment, each movable body 101 has been in the form of a connected assembly comprising the lifting body 102, upper and lower chains 104 and 105, and counterweight 103; however, the lifting body 102 and counterweight 103 may be connected to an endless chain, and in this case, noise can be reduced by guiding a wire by guide wheels and so can the weight of the carrying in-and-out device 40. Further, the production cost can be saved and the maintenance is easy.

In the above embodiment, the lift driving devices 121 have been disposed in the lateral boxes 43 of the lower main body 41; however, the lifter driving devices 121 may be disposed in the central box 42. Further, the travel driving devices 48 have been disposed in the lateral boxes 43; however, they may be disposed in the central box 42.

FIGS. 12 through 15 shows another embodiment of the invention. Of the posts 51A through 51D, the posts 51A and 51D formed with slits 55 and posts 51B and 51C provided with counterweights 103 communicate with each other through ducts 74. These ducts 74 are disposed between the upper regions of the opposed posts 51A and 51C and the opposed posts 51B and 51D. Further, the ducts are rectangularly prismatic and connected to the posts 51A through 51D through brackets 75 disposed at opposite ends and connectors 76 acting on the outer dovetail grooves 58. In order to allow the flow passages 77 in the ducts 74 to communicate with the posts 51A through 51D, the latter are formed with through-holes at predetermined places. In addition, the inner surfaces of the ducts 74 are formed with recesses 79 to avoid interference with said carrying in-and-out tool 91.

In this separate embodiment, during upward movement of the carriage 81, of the lifting bodies 102 in the posts 51A and BID and the counterweights 103 in the posts 51B and 51C, one is raised while the other is lowered. At this time, the air compressed in-the downward movement side can be smoothly removed by the suction forces of the lower fans 50. On the other hand, the air compressed in the upward movement side is compressed to a great extent, partly because the upper fans 72 discharge to the upper inner regions of the posts 51A through 51D, tending to develop a pumping phenomena, but this air tending to be compressed passes the through-holes 78 formed in the upper portions and flows into the flow passages 77 in the ducts 74, eventually flowing into the upper inner regions of the posts 51A through 51D on the side associated with downward flow passing through the through-holes 78 on the opposite side.

In this manner, during upward and downward movements, the air automatically moves to and fro between the upper inner regions of the posts 51A and 51D provided with the lifting bodies 102, thus making it possible to automatically cope with the pumping phenomena, and the foul air in the posts 51A through 51D is prevented from flowing through the slits 55 into the compartment 16 which has been cleaned.

In the separate embodiment described above, the ducts 74 have been disposed between the longitudinally opposed posts, i.e., between 51A and 51C, and between 51B and 51D have been provided; however, they may be disposed between the transversely opposed posts, i.e., between 51A and 51B and between 51C and 51D. Further, in the above embodiment, the ducts 74 have been disposed between the upper regions of the posts 51A through 51D; however, they may be disposed between the intermediate regions of the posts 51A through 51D.

In the two embodiments described above, the carrying in-and-out device 40 having four posts 51A through 51D erected on the lower main body 51 have been shown; however, the carrying in-and-out device 40 may have posts erected on the central box 42 in the longitudinal middle. In this case, a pair of posts spaced in the direction of travel may be erected, to provide a two-post type carrying in-and-out device 40, and only a single post may be erected at one end as seen in the direction of travel, to provide a single post type carrying in-and-out device 40.

In the two embodiments above, the type has been shown in which the carrying in-and-out device 40 is disposed between the pair of longitudinally spaced shelves 20; however, it may be a type in which one shelf 20 is combined with the carrying in-and-out device 40. In addition, various constructions will be employed as the clean air feeding units 30.

What is claimed is:

1. A load storing equipment having a cleaned compartment in which are disposed shelves and a carrying in-and-out device, said carrying in-and-out device comprising a lower main body supported and guided by a transverse floor rail, four posts erected on the lower main body, each of said posts having upper and lower ends, an upper frame connecting the upper ends of the posts, a carriage capable of vertical movement between opposed surfaces of the posts, a carrying in-and-out tool disposed on the carriage, and at least one carriage lifting device disposed to extend from the posts to the lower main body, wherein said upper frame is provided with guided assemblies to be guided by a ceiling rail, upper fans having suction ports directed to the guided assemblies and delivery ports directed to the upper ends of the posts, and said lower main body is provided with lower fans having suction ports directed to the lower ends of the posts.

2. A load storing equipment having a cleaned compartment in which are disposed shelves and a carrying in-and-out device, said carrying in-and-out device comprising a lower main body supported and guided by a floor rail, four posts erected on the lower main body, each of said posts having upper and lower ends, an upper frame connecting the upper ends of the posts, a carriage having a carrying in-and-out tool and being capable of vertical movement between opposed surfaces of the posts, and at least one carriage lifting device disposed to extend from the posts to the lower main body, wherein said carriage lifting device includes an endless movable body extending through a pair of said posts, between the upper ends of the pair of posts and through the lower main body, and a lifter driving device for moving the movable body forwardly and reversely, said carriage is connected to the movable body through a vertical slit formed in one of the pair of posts, said movable body disposed in the other one of the pair of posts being provided with a counterweight, and said post formed with the slit is connected with the post provided with the counterweight for communication through a duct.

3. A load storing equipment as set forth in claim 2, wherein the post formed with the slit and the post provided with the counterweight are connected to each other at the upper ends thereof for communication through the duct.

4. A load storing equipment having a cleaned compartment in which are disposed shelves and a carrying in-and-out device capable of travelling in a passage formed in front of the shelves, wherein each shelf defines a plurality of vertically and longitudinally spaced storage spaces, with a longitudinally extending dead space which is defined below the lowermost group of the storage spaces, said dead space having an open surface opposed to the passage, said shelf having two open surfaces, one being opposed to the passage and the other being opposite thereto, and defining rearward of the latter surface a further space having a lower end communicating with the dead space, said further space being provided with a plurality of clean air feeding units covering the storage spaces, said carrying in-and-out device comprising a lower main body supported and guided by a floor rail, at least one post erected on the lower main body, a carriage capable of vertical movement along the post, and a carrying in-and-out tool disposed in the carriage, part of said lower main body being positioned in the dead space, and each of said clean air feeding units comprising a box-like main body having an open surface opposed to one of the shelves, a filter covering the surface of the box-like main body opposed to the shelf, said box-like main body having a second surface, and a fan disposed on the second surface of the box-like main body and positioned in the space communicating with the dead space, said fan having a delivery port directed to the filter and a suction port directed to the space communicating with the dead space.

5. A load storing equipment as set forth in claim 4, wherein a pair of shelves are provided, each on opposite sides of the passage, and longitudinally projecting portions in the lower main body are positioned in the dead spaces of the two shelves.

* * * * *